United States Patent
Karanicolas (10) Patent No.: US 6,509,858 B2
(45) Date of Patent: Jan. 21, 2003

(54) DIFFERENTIAL VOLTAGE REFERENCE BUFFER

(75) Inventor: Andrew Karanicolas, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/747,203

(22) Filed: Dec. 21, 2000

(65) Prior Publication Data

US 2002/0080056 A1 Jun. 27, 2002

(51) Int. Cl.[7] ................................................ H03M 1/00
(52) U.S. Cl. ........................ 341/155; 341/156; 341/159
(58) Field of Search ................................. 341/155, 159, 341/166, 141, 133, 156; 327/561, 427, 563, 205, 100, 185, 199, 530

(56) References Cited

U.S. PATENT DOCUMENTS

| | | | | |
|---|---|---|---|---|
| 3,597,761 A | * | 8/1971 | Fraschilla et al. | .......... 341/159 |
| 4,542,370 A | * | 9/1985 | Yamada et al. | .............. 341/133 |
| 4,763,106 A | * | 8/1988 | Gulczynski | .................. 341/141 |
| 5,231,399 A | * | 7/1993 | Gorman et al. | .............. 341/159 |
| 5,359,328 A | * | 10/1994 | Sills | ............................ 341/155 |
| 5,489,904 A | * | 2/1996 | Hadidi | ........................ 341/156 |
| 5,717,396 A | * | 2/1998 | Gross, Jr. et al. | ............ 341/166 |

FOREIGN PATENT DOCUMENTS

EP           0 372 547      * 6/1990

* cited by examiner

*Primary Examiner*—Michael Tokar
*Assistant Examiner*—Jean Bruner Jeanglaude
(74) *Attorney, Agent, or Firm*—Seth Z. Kalson (57) ABSTRACT

A reference buffer circuit having a first reference voltage circuit to provide a first reference voltage at a first port to sink a first current at the first port; a second reference voltage circuit to provide a second reference voltage at a second port to sink a second current at the second port; and a current source circuit to source a source current at an output port, where the output port is connected to the second port. In one application, the first and second ports are connected to a resistor ladder network of a flash analog-to-digital converter.

12 Claims, 8 Drawing Sheets

DIFFERENTIAL VOLTAGE REFERENCE BUFFER

FIELD

Embodiments of the present invention relate to circuits, and more particularly, to analog circuits for analog-to-digital converters.

BACKGROUND

Figure 1:
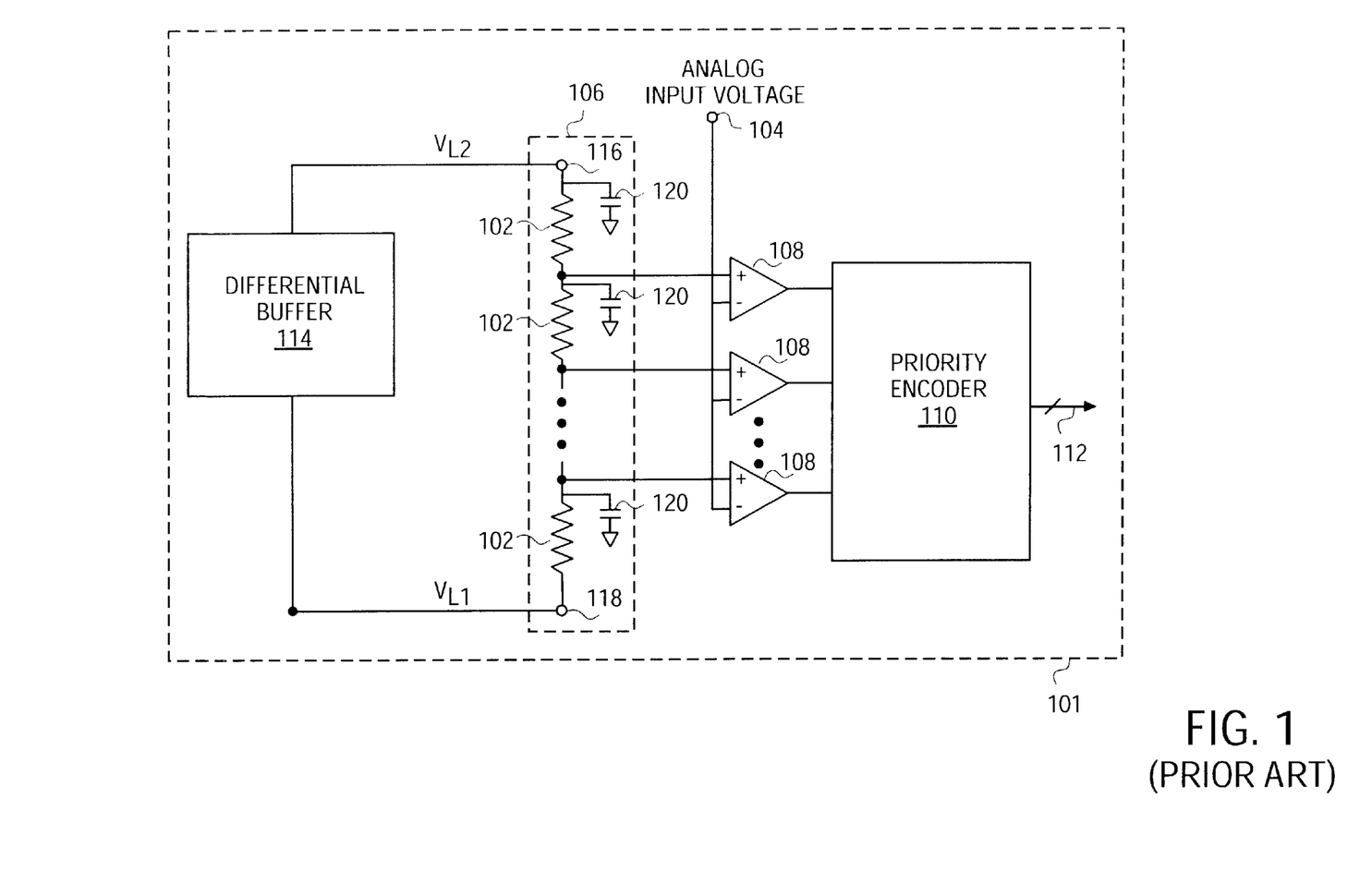
FIG. 1 is a prior art analog-to-digital converter biased by a prior art reference buffer.

Flash (or parallel) analog-to-digital converters (ADCs) are often employed in high speed communication devices in which it is desired to quickly convert an analog input voltage signal to a digital output voltage signal. FIG. 1 provides a high-level functional block diagram of a typical flash ADC. Differential voltage reference buffer 114 provides voltages $V_{L2}$ and $V_{L1}$ to resistor ladder network 106 at ports 116 and 118, respectively. Resistor ladder network 106 comprises $2^n-1$ resistors 102. An analog input voltage signal is applied to analog input port 104, and $2^n-1$ comparators 108 compare the latched analog input voltage to $2^n-1$ voltages provided by resistor ladder network 106. The outputs of comparators 108 are provided to priority encoder 110, and priority encoder 110 encodes the outputs of comparators 108 into the digital output voltage on output port 112. The flash ADC of FIG. 1 is part of larger circuit 101, which may be, for example, a high speed communication device such as a Gigabit Ethernet PHY.

Resistor ladder network 106 is often implemented as one or more metallization layers in a silicon process, and as a result it tends to have a relatively low resistance. Resistor ladder network 106 is often bypassed with a large amount of capacitance, typically MOS (Metal Oxide Semiconductor) devices, as indicated by capacitors 120. It is usually desirable for differential voltage reference buffer 114 to provide a low impedance voltage source at ports 116 and 118 to resistor ladder network 106, where the voltage is stable with good immunity to low and high frequency power supply variations, as well as other environmental parameters.

Figure 2:
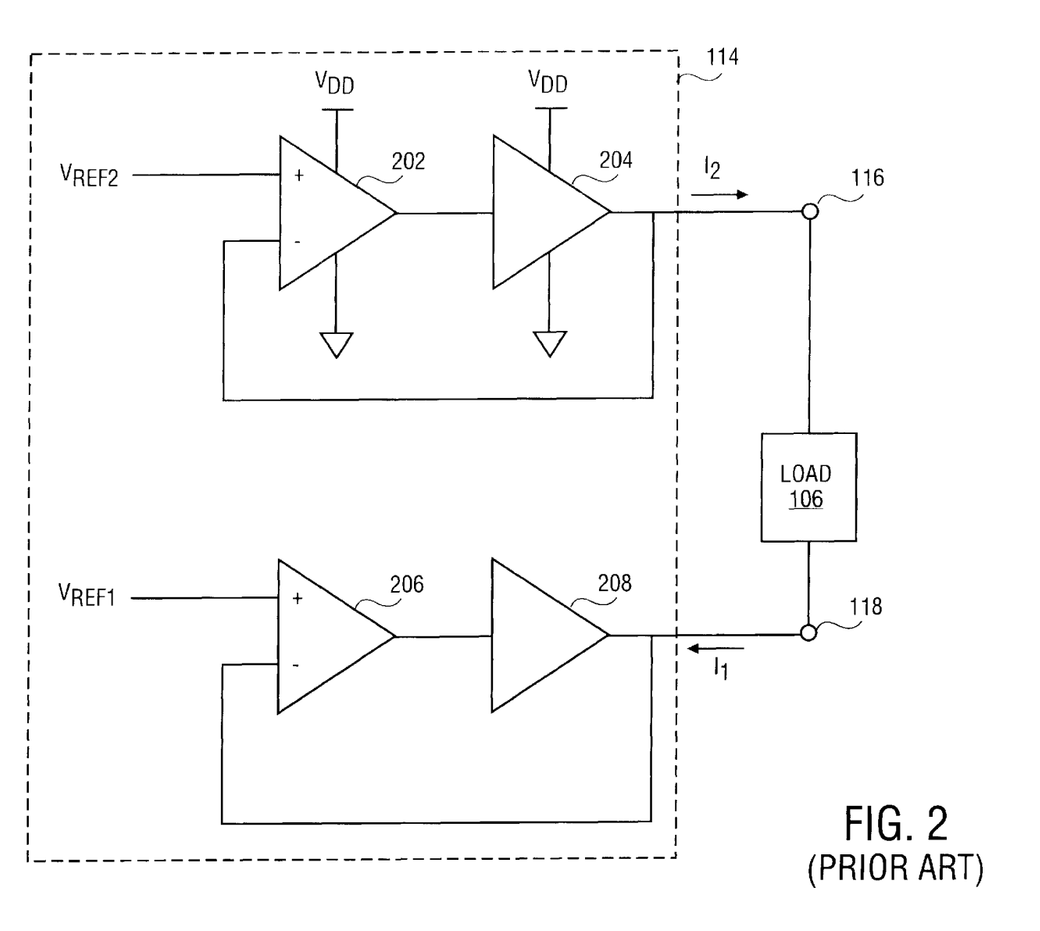
FIG. 2 is a prior art high-level functional diagram of a reference buffer.

FIG. 2 illustrates a functional diagram for differential voltage reference buffer 114 driving resistor ladder network 106. A reference voltage $V_{REF2}$ is applied to the non-inverting input port of differential amplifier 202. Differential amplifier 202 and output stage 204 are configured to source a current $I_2$ to port 116 and to provide reference voltage $V_{REF2}$ at port 116. A reference voltage $V_{REF1}$ is applied to the non-inverting input port of differential amplifier 206. Differential amplifier 206 and output stage 208 are configured to sink a current $I_1$ from port 118 so as to provide reference voltage $V_{RF1}$ at port 118. The average values Of $I_2$ and $I_1$ are substantially equal to each other, although the instantaneous values m ay not be equal due to capacitors 120.

Figure 3A:
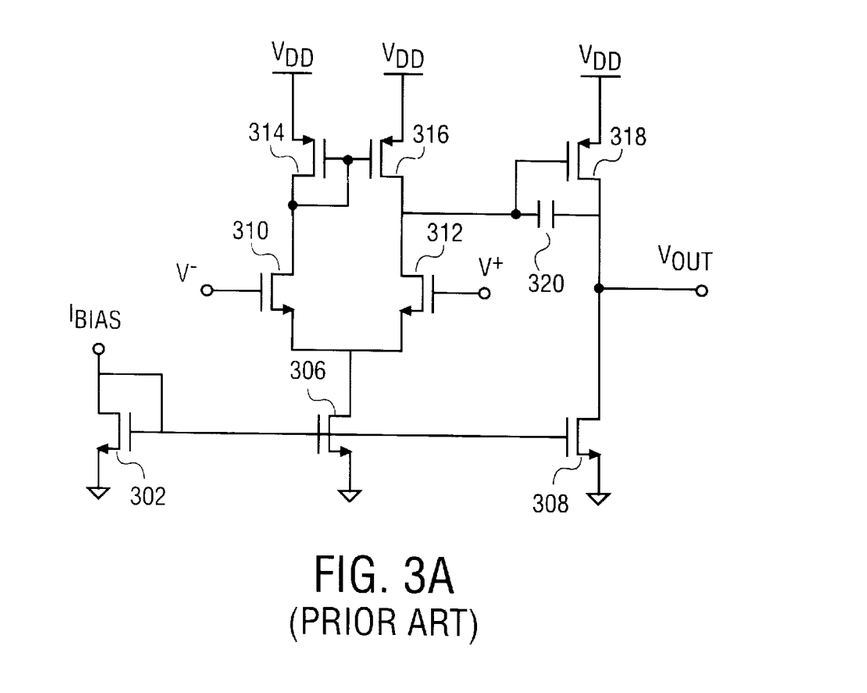
FIGS. 3A and 3B are a prior art circuit level diagrams of a reference buffer.
Figure 3B:
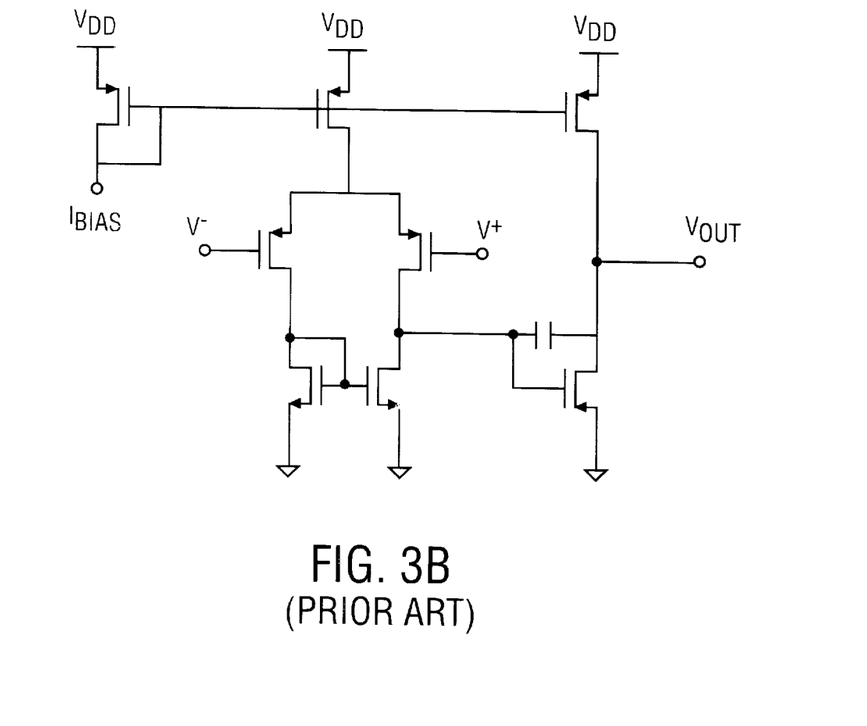

FIG. 3A provides a circuit diagram for an OPAMP (operational amplifier) comprising differential amplifier 202 and output stage 204, and FIG. 3B provides a circuit diagram for an OPAMP comprising differential amplifier 206 and output stage 208. In FIG. 3A, a bias current biases a current mirror comprising nMOSFETs (n-Metal Oxide Semiconductor Field Effect Transistor) 302, 306, and 308. nMOSFET 306 provides bias current to a differential amplifier comprising nMOSFET differential pairs 310 and 312, and pMOSFET pairs 314 and 316. The gates of nMOSFETs 310 and 312 are the inverting and non-inverting input ports, respectively. The output stage comprises pMOSFET 318, which is Miller compensated via capacitor 320. nMOSFET 308 biases pMOSFET 318. Similar statements apply to the circuit of FIG. 3B.

Because of the relatively low resistance of resistor ladder network 106, a relatively large current is often needed to establish the correct voltage difference across resistor ladder network 106. As a result, the device sizes in output stages of differential voltage reference buffer 114 are often relatively large so as to handle the relatively large current through resistor ladder network 106. One consequence of this device size is that good PSSR (Power Supply Rejection Ratio) may be difficult to achieve. In particular, pMOSFETs tend to dominate the response from power supply variations compared to nMOSFETs because pMOSFETs are referenced to the supply voltage $V_{DD}$ and nMOSFETs are referenced to the ground (or substrate) voltage $V_{SS}$. Furthermore, pMOSFETs in the signal path of an OPAMP may amplify power supply variations. In particular, pMOSFET 318 in the output stage of FIG. 3A may reduce the PSRR. However, improving the PSRR by employing external bypass capacitors may not be practical in a highly integrated environment such as a communication transceiver, e.g., a Gigabit Ethernet PHY.

DESCRIPTION OF THE EMBODIMENTS

Figure 4:
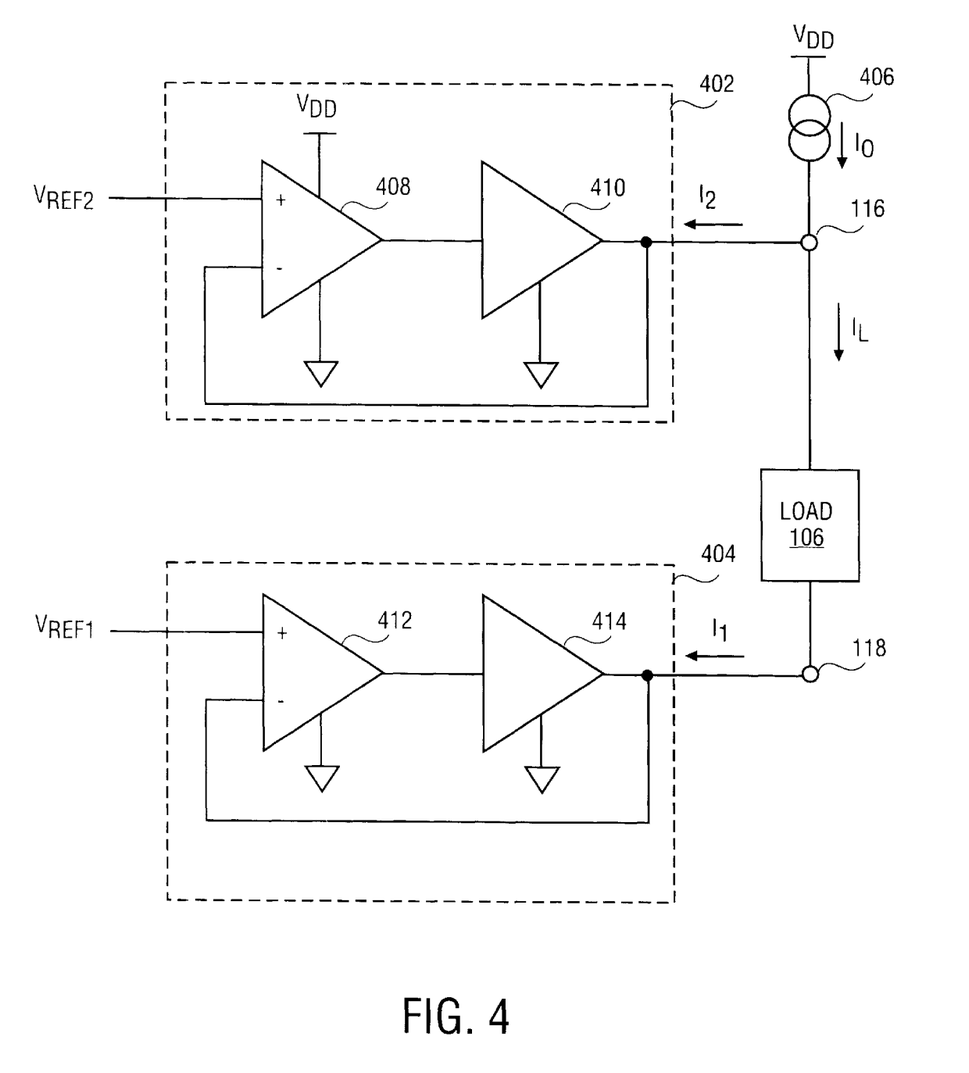
FIG. 4 is a high-level functional diagram of a reference buffer according to an embodiment of the present invention

A high-level functional diagram of an embodiment is shown in FIG. 4, where OPAMP 402, OPAMP 404, and current source 406 are used to drive a load current $I_L$ through resistor ladder network 106. OPAMPs 402 and 404 may also be referred to as reference voltage circuits. Current source 406 provides a current $I_0$ to port 116, OPAMP 402 sinks a current $I_2$ from port 116, and OPAMP 404 sinks a current $I_1$ from port 118.

On average, $I_0=I_1+I_2$ and $I_L=I_1$. OPAMP 402 is configured to provide a stabilized voltage $V_{REF2}$ at port 116, and OPAMP 404 is configured to provide a stabilized voltage $V_{REF1}$ at port 118. In the particular embodiment of FIG. 4, OPAMP 402 comprises differential amplifier 408 and output stage 410, and OPAMP 404 comprises differential amplifier 412 and output stage 414.

Differential amplifiers 408 and 412 may employ both nMOSFETs and pMOSFETs. However, output stages 410 and 414 employ only nMOSFETs, and are not supplied with the supply voltage $V_{DD}$. Current source 406 typically comprises one or more pMOSFETs, and in the embodiment of FIG. 4, these pMOSFETs are not in the signal path of an amplifier. Because pMOSFETs are not in the signal path of output stages 410 and 414 for the embodiment of FIG. 4, the PSRR is improved over the prior art shown in FIGS. 2, 3A, and 3B. Furthermore, in some embodiments, the gate-to-source terminals of the pMOSFETs in current source 406 may be heavily bypassed with capacitors to further improve PSRR.

Figure 5:
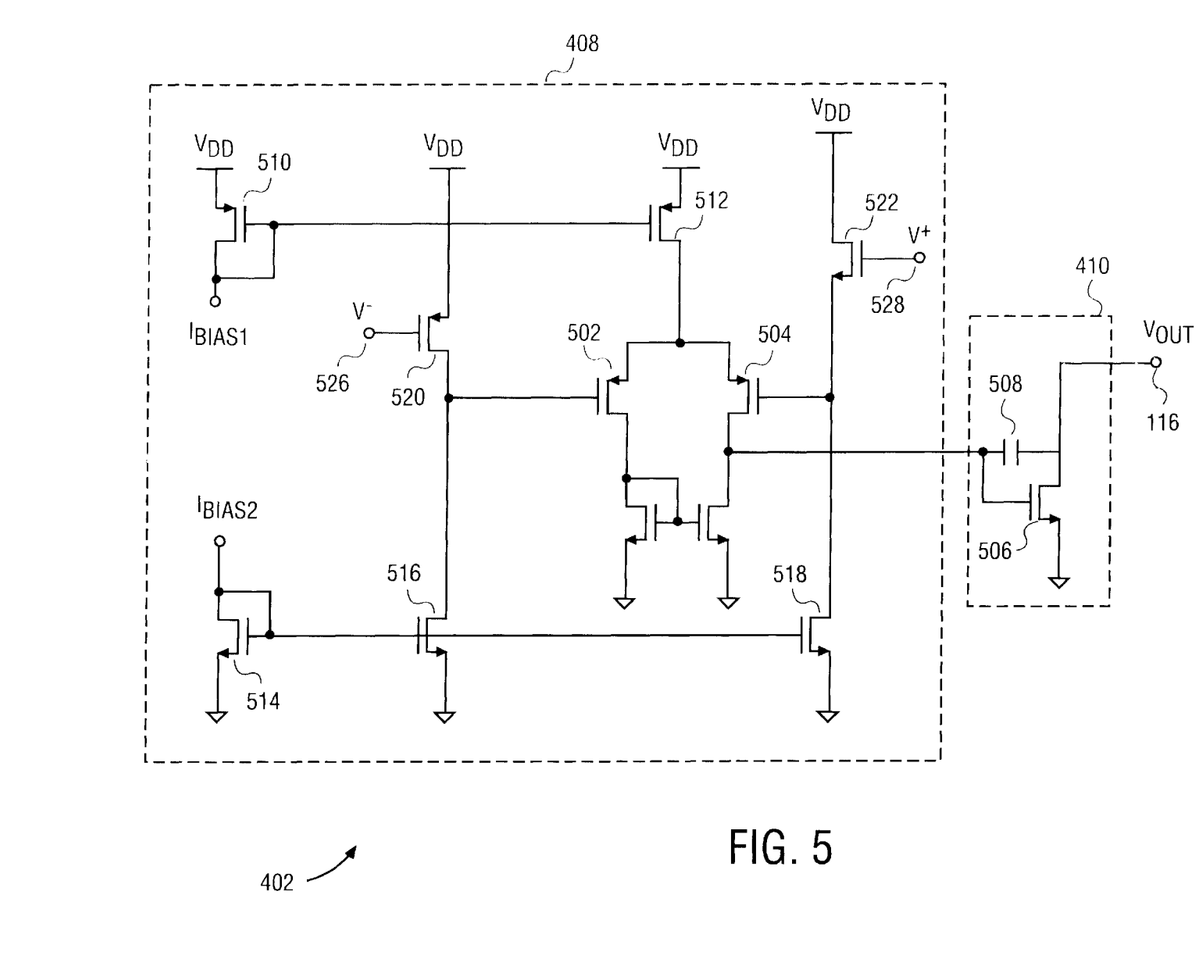
FIG. 5 is a circuit for an OPAMP in the embodiment of FIG. 4.

A circuit for an embodiment of OPAMP 402 is provided in FIG. 5, where differential amplifier 408 and output stage 410 are indicated by dashed lines. The circuit of FIG. 5 is a two-stage Miller compensated design, comprising pMOSFET differential pair 502 and 504, and output stage 410 comprising nMOSFET 506 with compensation capacitor 508. nMOSFET 506 sinks a current I2 from port 116. Note that nMOSFET 506 is not connected to the supply voltage $V_{DD}$.

In FIG. 5, bias current $I_{bias1}$ biases pMOSFET current mirror 510 and 512 to provide bias current to pMOSFET differential pair 502 and 504. Bias current $I_{bias2}$ biases nMOSFET current mirror 514, 516, and 518 to provide bias current to nMOSFETs 520 and 522. In one embodiment, the reference voltage $V_{REF2}$ and OPAMP output voltage at port 116 are about 1.6V, which may make it difficult to bias a pMOSFET differential pair. Consequently, nMOSFETs 520 and 522 serve as source followers to provide a level shift at the input voltages, so that input port 526 is the inverting input port and input port 528 is the non-inverting port.

Figure 6:
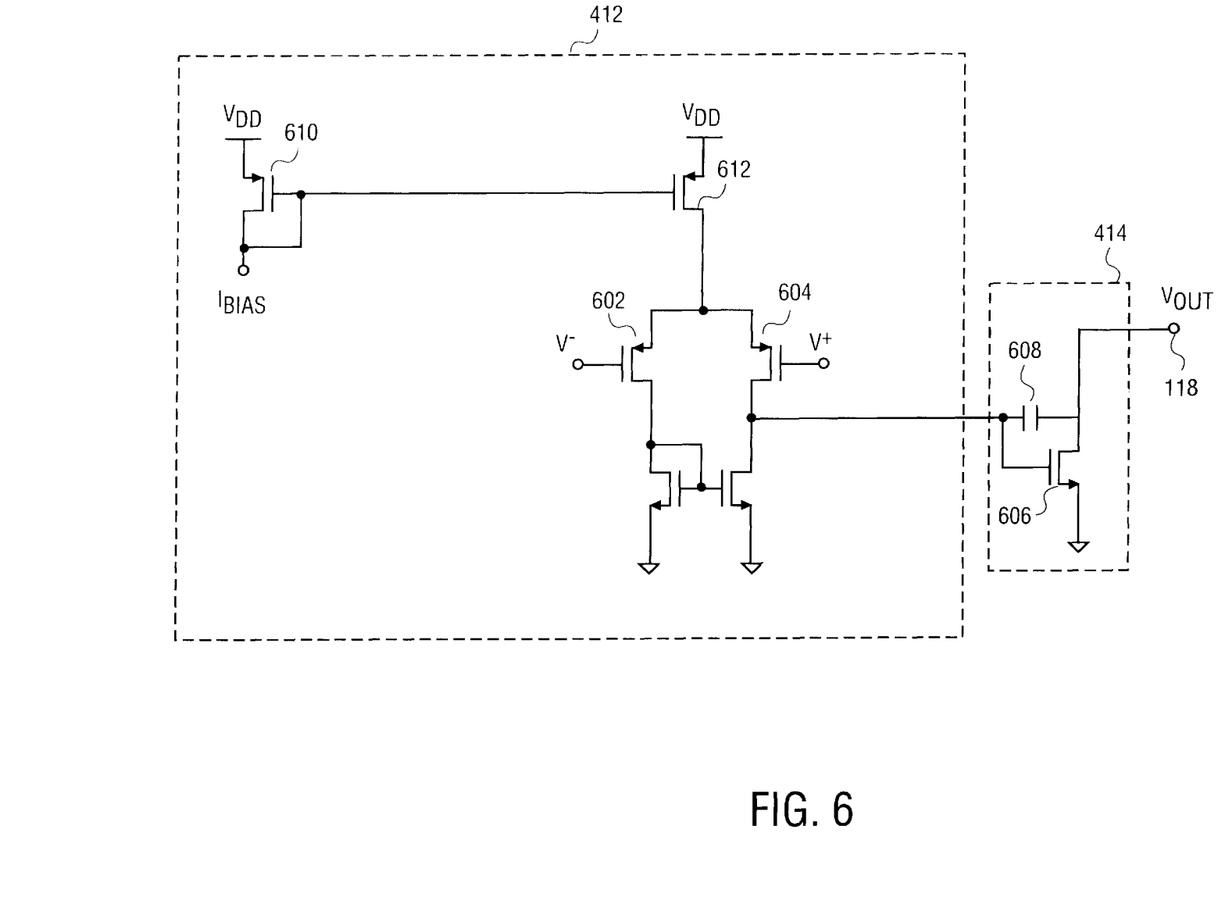
FIG. 6 is a circuit for another OPAMP in the embodiment of FIG. 4.

A circuit for an embodiment of OPAMP 404 is provided in FIG. 6, where differential amplifier 412 and output stage 414 are indicated by dashed lines. The circuit of FIG. 6 is a two-stage Miller compensated design, comprising pMOSFET differential pair 602 and 604, and output stage 414 comprising nMOSFET 606 with compensation capacitor 608. Bias current $I_{bias}$ biases pMOSFET current mirror 610 and 612 so as to bias differential pair 602 and 604. nMOSFET 606 sinks a current $I_1$ from port 118.

In one embodiment, the output voltage at port 116 is 1.6V and about 2.08 mA is sunk by nMOSFET 506. The output voltage at output port 118 is 0.8V and about 2.08 mA is sunk by nMOSFET 606, so that current source 406 provides about 4.16 mA. The capacitance of capacitors 508 and 608 are about 3 pF. However, these quantities for current, voltage, and capacitance are for illustrative purposes only, and other embodiments may have different physical quantities for the current, voltage, and capacitance.

Figure 7:
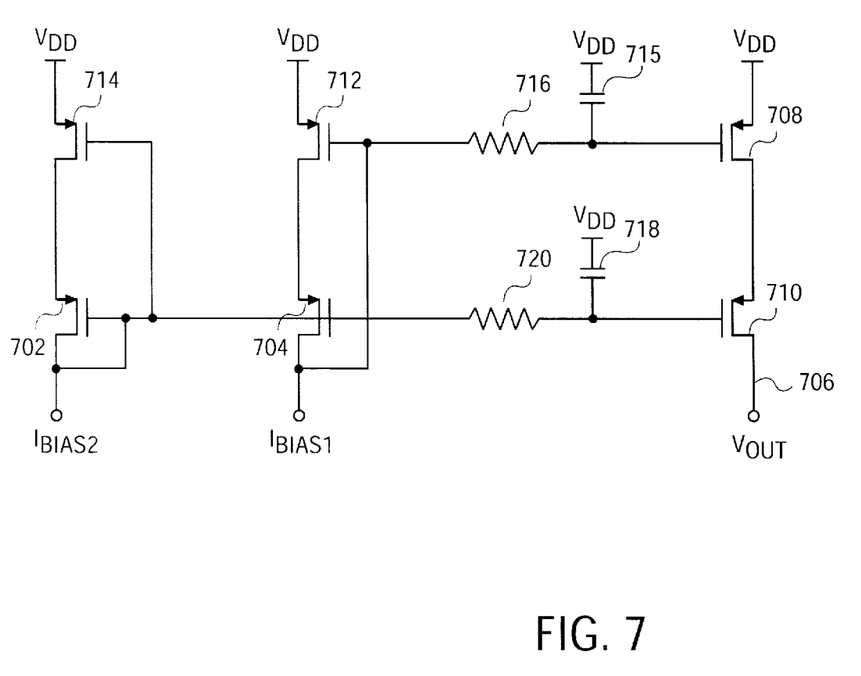
FIG. 7 is a circuit for a current source in the embodiment of FIG. 4.

An embodiment of current mirror 406 is illustrated in FIG. 7, where bias current $I_{bias2}$ biases pMOSFETs 702 and 714, bias current $I_{bias1}$ biases pMOSFETs 704 and 712, and current is sourced at output port 706 to port 116. The biasing currents in FIG. 7 are not necessarily the same as the biasing currents in FIG. 5, although for simplicity the same notation is used. pMOSFETs 710 and 708 are connected in cascode fashion, and pMOSFETs 704 and 712 are connected in cascode fashion. With the gates of pMOSFETs 704 and 710 connected together, and with the gates of pMOSFETs 712 and 708 connected together and to the drain of pMOSFET 704, the drain-to-source voltages of pMOSFETs 712 and 708 are kept substantially equal to each other so that the output current sourced at output port 706 is well-controlled, and the output impedance looking into output port 706 is relatively large. pMOSFETs 702 and 714 bias the gates of pMOSFETs 704 and 710. Capacitor 715 and resistor 716 function as a low-pass filter to filter out high-frequency variations on the gate of pMOSFET 712. Similarly, capacitor 718 and resistor 720 function as a low-pass filter to filter out high-frequency variations on the gate of pMOSFET 704. Capacitors 714 and 718 also help to reduce the effect of high-frequency variations of the supply voltage $V_{DD}$ on the current sourced at output port 706.

Figure 8:
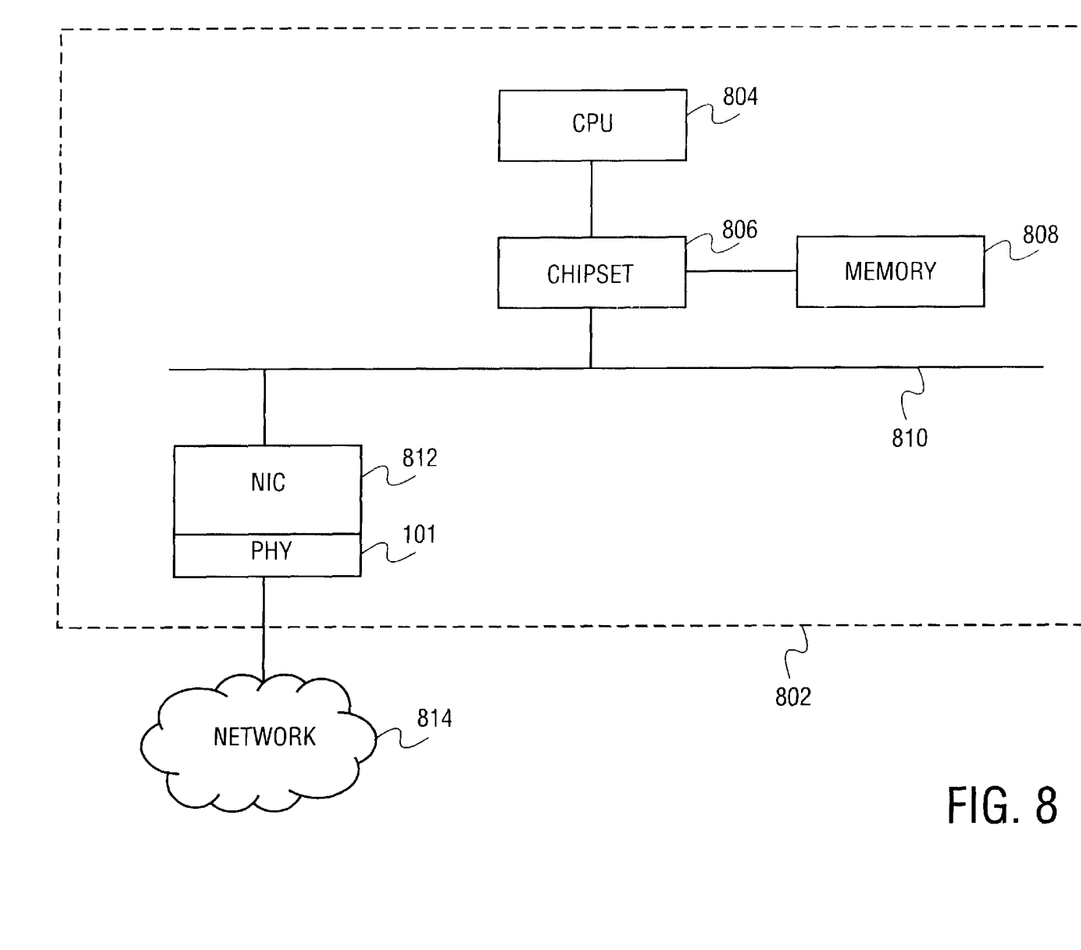
FIG. 8 illustrates a computer system employing an embodiment of the present invention.

Embodiments of the present invention may be employed in many devices and systems. One such system is illustrated in FIG. 8, where computer system 802 comprises central processing unit (CPU) 804, chipset 806, system memory 808, and system bus 810. Network Interface Card (NIC) 812 comprises Gigabit Ethernet PHY 101, where PHY 101 also includes an embodiment of the present invention to bias a resistor ladder network of an ADC (not shown), such as the embodiment of FIG. 4. NIC 812 is coupled to network 814, which may be an Gigabit Ethernet, and is coupled to system bus 810 to communicate with CPU 804.

Various modifications may be made to the disclosed embodiments without departing from the scope of the invention as claimed below. For example, bipolar transistors may be employed instead of MOSFETs, or a combination of the two types of transistors may be employed. For example, output stages 410 and 414 may comprise npn transistors to sink currents $I_2$ and $I_1$ respectively.

I claim:

1. A reference buffer having first and second ports to provide a first reference voltage at the first port and a second reference voltage at the second port, the buffer reference comprising:

a first reference voltage circuit to provide the first reference voltage at the first port, the first reference voltage circuit comprising an output stage to sink a first current from the first port;

a second reference voltage circuit to provide the second reference voltage at the second port, the second reference voltage circuit comprising an output stage to sink a second current from the second port; and a current source circuit having an output port to source a source current at the output port;

wherein the output port is connected to the second port.

2. The reference buffer as set forth in claim 1, the output stage of the first reference voltage circuit comprising a first nMOSFET to sink the first current, and the output stage of the second reference circuit comprising a second nMOSFET to sink the second current.

3. The reference buffer as set forth in claim 2, wherein when the first and second ports are connected to a resistive load, the sum of the first and second currents are substantially equal in magnitude to the source current.

4. The reference buffer as set forth in claim 1, wherein when the first and second ports are connected to a resistive load, the sum of the first and second currents are substantially equal in magnitude to the source current.

5. A reference buffer having first and second ports to provide a first reference voltage at the first port and a second reference voltage at the second port, the reference buffer comprising:

a first reference voltage circuit to provide the first reference voltage at the first port, the first reference voltage circuit comprising a first nMOSFET having a drain connected to the first port to sink a first current;

a second reference voltage circuit to provide the second reference voltage at the second port, the second reference voltage circuit comprising a second nMOSFET having a drain connected to the second port to sink a second current from the second port; and a current source circuit having an output port to source a source current at the output port;

wherein the output port is connected to the second port.

6. The reference buffer as set forth in claim 5, wherein the current source circuit comprises a first pMOSFET and a second pMOSFET coupled in cascode fashion, wherein the first pMOSFET has a drain connected to the output port to source the source current.

7. An analog-to-digital converter comprising:
a resistor ladder network having a first port and a second port;
a first reference voltage circuit to provide a first reference voltage at the first port, the first reference voltage circuit comprising an output stage to sink a first current from the resistor ladder network;
a second reference voltage circuit to provide a second reference voltage at the second port, the second reference voltage circuit comprising an output stage to sink a second current from the resistor ladder network; and
a current source circuit having an output port to source a source current to the resistor ladder network and the second reference voltage circuit.

8. The analog-to-digital converter as set forth in claim 7, the output stage of the first reference voltage circuit comprising a first nMOSFET having a drain connected to the first port to sink the first current, and the output stage of the second voltage reference circuit comprising a second nMOSFET having a drain connected to the second port to sink the second current.

9. A circuit comprising:
a load having a first port and a second port;
a first reference voltage circuit to provide a first reference voltage at the first port, the first reference voltage circuit comprising an output stage to sink a first current from the load;
a second reference voltage circuit to provide a second reference voltage at the second port, the second reference voltage circuit comprising an output stage to sink a second current from the load; and
a current source circuit having an output port to source a source current to the load and the second reference voltage circuit.

10. The circuit as set forth in claim 9, the output stage of the first reference voltage circuit comprising a first nMOSFET having a drain connected to the first port to sink the first current, and the output stage of the second voltage reference circuit comprising a second nMOSFET having a drain connected to the second port to sink the second current.

11. A computer system comprising:
a communication circuit comprising
an analog-to-digital converter comprising a resistor ladder network having a first port and a second port;
a first reference voltage circuit to provide a first reference voltage at the first port, the first reference voltage circuit comprising an output stage to sink a first current from the resistor ladder network;
a second reference voltage circuit to provide a second reference voltage at the second port, the second reference voltage circuit comprising an output stage to sink a second current from the resistor ladder network; and
a current source circuit having an output port to source a source current to the resistor ladder network and the second reference voltage circuit.

12. The computer system as set forth in claim 11, the output stage of the first reference voltage circuit comprising a first nMOSFET having a drain connected to the first port to sink the first current, and the output stage of the second voltage reference circuit comprising a second nMOSFET having a drain connected to the second port to sink the second current.

* * * * *

UNITED STATES PATENT AND TRADEMARK OFFICE
CERTIFICATE OF CORRECTION

PATENT NO.   : 6,509,858 B2
DATED        : January 21, 2003
INVENTOR(S)  : Karanicolas It is certified that error appears in the above-identified patent and that said Letters Patent is hereby corrected as shown below:

<u>Column 1,</u>
Line 51, delete "Of" and insert -- of --.
Line 53, delete "m ay" and insert -- may --.

<u>Column 3,</u>
Line 11, delete "12" and insert -- I $_2$ --.

Signed and Sealed this

Eighth Day of July, 2003

JAMES E. ROGAN
*Director of the United States Patent and Trademark Office*